US005696575A

United States Patent [19]
Kohnen et al.

[11] Patent Number: 5,696,575
[45] Date of Patent: Dec. 9, 1997

[54] DIGITAL FLUX GATE MAGNETOMETER

[75] Inventors: Kirk Kohnen, Fullerton; Eric K. Slater, Long Beach, both of Calif.

[73] Assignee: Hughes Aircraft, Los Angeles, Calif.

[21] Appl. No.: 636,617

[22] Filed: Apr. 23, 1996

[51] Int. Cl.[6] .................................................. G01R 33/04
[52] U.S. Cl. ............................................................. 324/254
[58] Field of Search .................................. 324/253, 254, 324/255, 249, 260; 33/361

[56]  References Cited

PUBLICATIONS

F. Primdahl, H. Hernando, J.R. Petersen and O.V. Nielson, "Digital Detection of the Flux–Gate Sensor Output Signal", Meas. Sc. Technol. 5 (1994).

*Primary Examiner*—Walter E. Snow
*Attorney, Agent, or Firm*—G. S. Grunebach; M. W. Sales; W. Denson-Low

[57]  ABSTRACT

Digital logic and a high resolution digital to analog converter are used to adequately digitize a magnetic signal that is subsequently processed by magnetic data processing algorithms. The high resolution digital to analog converter is directly incorporated in a feedback loop of a magnetometer sensor, an expensive precision analog to digital converter is replaced by a less expensive, lower power digital to analog converter. The circuit improvement provided by the present invention includes an analog low pass filter coupled to the sensor, a digital logic circuit coupled to the analog low pass filter for providing an output signal from the magnetometer and a feedback output signal, and the digital to analog converter coupled between the digital logic circuit and a feedback coil of the sensor for coupling the feedback output signal thereto. The digital logic circuit includes an analog to digital converter, an adder having a first input coupled to the analog to digital converter, and an accumulator coupled between an output of the adder and a second input of the adder. The digital logic circuitry processes the error signal from the analog multiplier, eliminates high frequency components, and digitizes the result. Thus, a low resolution analog to digital converter, having a resolution of only a few bits, may be used.

8 Claims, 1 Drawing Sheet

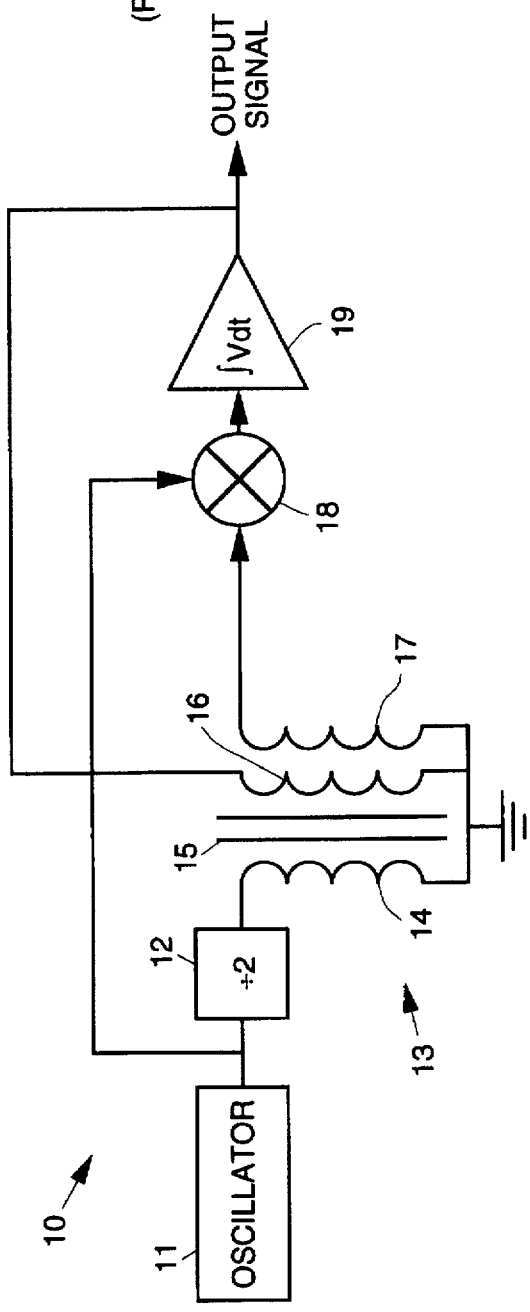
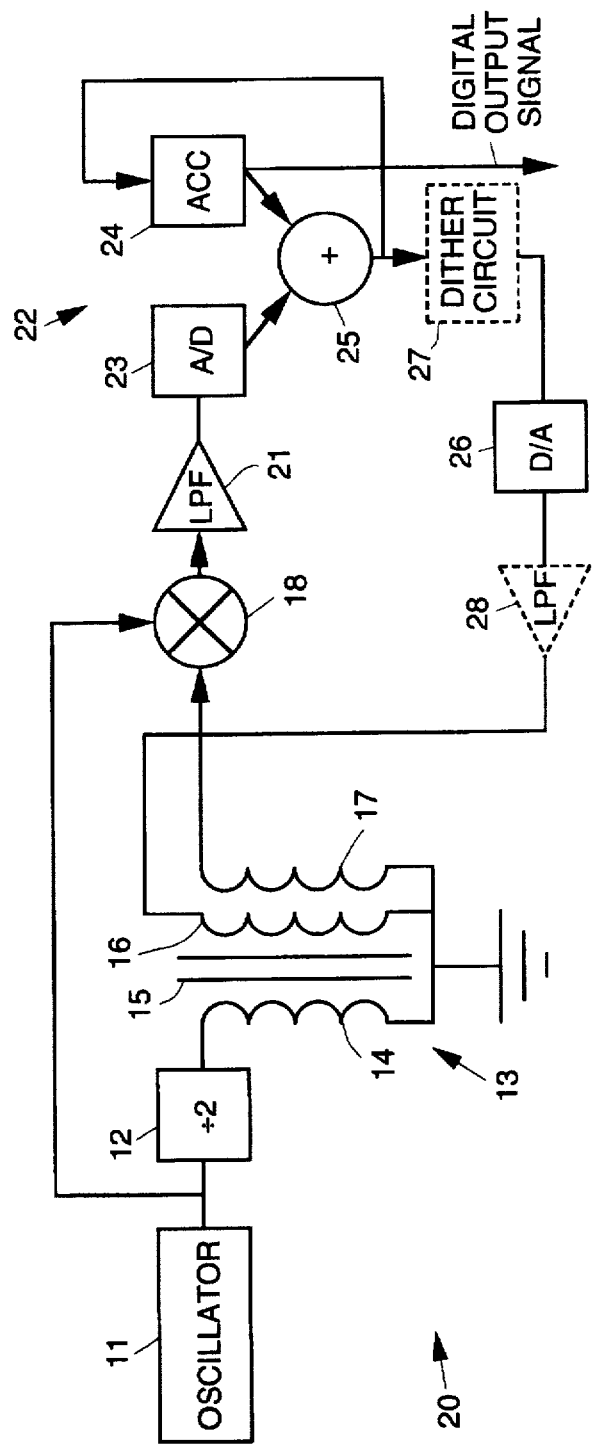

DIGITAL FLUX GATE MAGNETOMETER

BACKGROUND

The present invention relates generally to magnetometers, and more particularly, to a digital flux gate magnetometer.

The assignee of the present invention uses data from three axis flux gate magnetometers for its magnetic data processing systems such as those described in U.S. Pat. No. 5,239,474, and U.S. Pat. application Ser. No. 08/611,352, filed Mar. 5, 1996. The present state of the art employs an analog magnetic flux gate sensor and uses the output of an analog integrator as the magnetometer output. This signal is then digitized with an analog to digital converter having a large number of bits of resolution (typically >20). This requires the use of large, expensive, and power hungry analog to digital converters that presently have a dynamic range that is limited to around 22 bits of resolution. The analog integrator used in the analog flux gate sensor causes drift in the output signal of the sensor. The output of the analog flux gate sensor varies with temperature due to the non-constant resistance of the core windings with temperature.

A stopgap measure presently being utilized to get around the use of the expensive analog to digital converter is to employ an adjustable voltage reference and an analog subtractor to subtract the large constant part of the measured magnetic field due to the earth's magnetic field. Then, the remaining signal is digitized with a reduced resolution analog to digital converter (12 to 16 bits). This technique only works for applications in which the sensor is stationary with respect to the earth's magnetic field.

Alternatively, prior art magnetometers have used a very low frequency high pass filter to remove the constant component of the local field and then the remaining signal is digitized by an analog to digital converter. The prior art systems have the following drawbacks: They exhibit loss of absolute magnetic field values (which are useful for determining the heading of the sensor). They exhibit distortion (due to the high pass filtering) of the low frequency wave forms. Such distortion adversely impacts the performance the magnetic processing algorithms. They exhibit susceptibility to overload if the sensor is used in an application in which it is moved with respect to the ambient magnetic field.

Accordingly, it is an objective of the present invention to provide for a digital flux gate magnetometer that overcomes the limitations of conventional magnetometers.

SUMMARY OF THE INVENTION

To meet the above and other objectives, the present invention provides for a technique whereby digital logic and a high resolution digital to analog converter are used to adequately digitize a magnetic signal so that it may be subsequently processed by magnetic data processing systems developed by the assignee of the present invention. By incorporating the high resolution digital to analog converter directly in a feedback loop of a magnetic sensor, an expensive precision analog to digital converter is replaced by a less expensive, lower power digital to analog converter.

More specifically, the present invention provides for a flux gate magnetometer comprising an oscillator for generating a signal, a divider coupled to the oscillator for dividing the frequency of the signal by two, a sensor coupled to the divider that includes a drive coil, magnetic core material, a feedback coil, a sense coil, and an analog multiplier coupled to the sense coil and the oscillator. The improvement provided by the present invention includes an analog low pass filter coupled to the output of the analog multiplier, a digital logic circuit coupled to the analog low pass filter for generating a digital output signal from the magnetometer and a feedback output signal, and a digital to analog converter coupled between the digital logic circuit and the feedback coil of the sensor for coupling the feedback output signal to the sensor.

The digital logic circuitry includes an analog to digital converter, an adder having a first input coupled to the analog to digital converter, and an accumulator coupled between an output of the adder and a second input of the adder. The digital logic circuitry processes the error signal from the analog multiplier, eliminates high frequency components, and digitizes the result. Thus, a low resolution analog to digital converter, having a resolution of only a few bits, may be used.

The analog to digital converter converts the output of the low pass filter to a digital value that is added to the value of the accumulator. This updated digital value is converted to an analog signal by the high resolution digital to analog converter. The output of the high resolution digital to analog converter is used to change the drive of the feedback coil to minimize the error value at the output of the low pass filter. This process continues until the output of the low pass filter becomes effectively zero.

The resolution of digital to the analog converter can be increased by further rapidly changing the digital input applied thereto and then low pass filtering the output thereof. This approach sacrifices frequency bandwidth for increased resolution. Three or more bits may be added to the resolution of available digital to analog converters by dithering the digital input and low pass filtering the output thereof. This optional aspect of the present is invention provided by a dither circuit before the low pass filter and after the digital to analog converter.

In general, magnetic flux gate sensors rely on a current feedback loop. This current is determined by taking the voltage of the circuit, and dividing it by the resistance of the (typically copper) core winding. The resistance of the core winding varies with temperature, causing the sensor measurements to drift with temperature. Commonly available high resolution D/A converters put out a current that is a function of the input signal. In the present invention, this current is constant over the varying resistance of the core winding, causing the present invention to be much less temperature dependent.

The present invention decreases power consumption by replacing the high resolution (typically >20 bit) analog to digital converter with a similarly sized digital to analog converter. This reduces the power consumption. The present invention eliminates low frequency circuit noise and drift caused by the imperfect analog integrator that is typically used in flux gate magnetic sensors. The present invention decreases the circuit size requirements, as high resolution analog to digital converters are considerably larger than high resolution digital to analog converters.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 shows a conventional flux gate magnetometer which is improved upon by the present invention; and FIG. 2 shows a digital flux gate magnetometer in accordance with the principles of the present invention.

DETAILED DESCRIPTION

The present invention provides for improvements to current magnetic flux gate sensor technology. Referring to the drawing figures, FIG. 1 shows a conventional flux gate magnetometer 10 which is improved upon by the present invention, and which is shown for the purposes of understanding the present invention.

In the conventional flux gate magnetometer 10, an oscillator 11 generates a signal, and the frequency of this signal is divided by two in a divider 12 and is used to drive magnetic core material 15 of a magnetic sensor 13. The sensor 13 includes a drive coil 14, the magnetic core material 15, a feedback coil 16, and a sense coil 17. The core material 15 is a magnetically saturatable material that is driven into the saturated state twice with every two cycles of the waveform of the output signal from the oscillator 11.

The sense coil 17 is coupled to a first input of an analog multiplier 18 while the output signal from the oscillator 11 is coupled to a second input of the analog multiplier 18. The output of the analog multiplier 18 is integrated in an integrator 19 that provides an output signal from the magnetometer 10, which output signal is fed back to the feedback coil 16 of the sensor 13.

The nature of the core material 15 is such that if it is in a magnetic field, the sense coil 17 detects an AC signal at twice the drive frequency. This signal is multiplied (in the analog domain) with twice the drive coil frequency thereby frequency shifting the signal down to DC. This DC signal represents the difference in magnetic field seen by the core material 15 due to the ambient field (the field that is sensed) and the magnetic field due to the feedback coil 16.

Because the feedback and sense coils 16, 17 operate at different frequencies, in some sensors 13 they are the same coil appropriately coupled to the sensor 13. Thus, the integrator 19 corrects the drive to the feedback coil 16 to keep the output of the analog multiplier 18 (and therefore the magnetic field as seen by the core material 15) as close to zero as possible.

When the circuit is in equilibrium, the output of the integrator 19 is a signal equal and opposite to the magnetic field that is measured by the core material 15. The output signal of the magnetometer 10 is taken from this point. For many applications, the output signal is then digitized to a provide high resolution (often >20 bits) signal. This digitization requires an expensive analog to digital converter (not shown).

The present invention provides an improved arrangement for generating a digital output signal from the magnetic flux gate sensor 13. A block diagram of a digital flux gate magnetometer 20 in accordance with the principles of the present invention is shown in FIG. 2.

In the present invention, the conventional analog integrator 19 is replaced by an analog low pass filter 21 and associated digital logic circuitry 22. The digital logic circuitry 22 include an analog to digital converter 23, an accumulator 24, and an adder 25. One output from the digital logic circuitry 22 is provided by the accumulator 24 which is the output of the magnetometer 20. A feedback output of the digital logic circuitry 22 is taken from the adder 25 which is coupled by way of a digital to analog converter 26 to the feedback coil 16 of the sensor 13.

The digital logic circuitry 22 takes the filtered error signal from the analog multiplier 21, and digitizes the result. Because the error signal is small during proper operation of the sensor 13, a high resolution analog to digital converter is not needed at this location. Depending on the required slew rate and response time, a very low resolution analog to digital converter 23, having a resolution of only a few bits, may be used.

As the measured magnetic signal changes, the output of the low pass filter 21 becomes non-zero. The analog to digital converter 23 converts this to a digital value that is then added to the accumulator value. This updated digital value is converted to an analog signal by the high resolution digital to analog converter 26. The output of this high resolution digital to analog converter 26 is then used to change the drive of the feedback coil 16 to minimize the error value at the output of the low pass filter 21. This process continues until the output of the low pass filter 21 becomes effectively zero again.

In the ideal case, when the sensor 13 is in equilibrium, the output of the analog to digital converter 23 is zero and the feedback drive signal is constant. In a physically realizable equilibrium case, the output of the analog to digital converter 23 is a zero mean noisy signal.

High resolution digital to analog converters 26 are readily available due to the consumer market for digital audio devices. The resolution of these high frequency devices (typically >44 KHz) can be increased by rapidly changing the digital input to the digital to the analog to digital converter 26 and then low pass filtering the output. This approach sacrifices frequency bandwidth for increased resolution. The frequencies of interest in measured magnetic fields is often one or two orders of magnitude lower than audio frequencies. Because of this, three or more bits may be added to the resolution of available consumer digital to analog converters 26 by dithering the digital input and low pass filtering the output thereof. This optional aspect of the present invention is illustrated in FIG. 2 by dashed boxes corresponding to a dither circuit 27 and low pass filter (LPF) 28 before and after the digital to analog converter 26.

Thus, an improved digital flux gate magnetometer has been disclosed. It is to be understood that the described embodiment is merely illustrative of some of the many specific embodiments which represent applications of the principles of the present invention. Clearly, numerous and varied other arrangements may be readily devised by those skilled in the art without departing from the scope of the invention.

What is claimed is:

1. A flux gate magnetometer comprising:

an oscillator for generating a signal;

a divider coupled to the oscillator for dividing the frequency of the signal by two;

a sensor coupled to the divider that comprises a drive coil, magnetic core material, a feedback coil, a sense coil, and an analog multiplier having a first input coupled to the sense coil and a second input coupled to the oscillator and an output;

an analog low pass filter coupled to the output of the analog multiplier;

a digital logic circuit coupled to the analog low pass filter for providing a digital output signal that comprises the output signal from the magnetometer, and a feedback output signal; and a digital to analog converter coupled between the digital logic circuit and the feedback coil the sensor for coupling the feedback output signal to the feedback coil of the sensor.

2. The magnetometer of claim 1 wherein the core material is a magnetically saturatable material that is driven into the saturated state twice with each two cycles of the waveform of the output signal from the oscillator.

3. The magnetometer of claim 1 wherein the digital logic circuitry comprises:

an adder having one digital converter;

an adder having one input coupled to an output of the analog to digital converter; and an accumulator coupled between an output of the adder and a second input of the adder.

4. The magnetometer of claim 1 further comprising:

a dither circuit coupled between the digital logic circuitry and an input of the digital to analog converter; and a low pass filter coupled between the digital to analog converter and the sense coil of the sensor.

5. The magnetometer of claim 3 further comprising:

a dither circuit coupled between the adder and an input of the digital to analog converter; and a low pass filter coupled between the digital to analog converter and the sense coil of the sensor.

6. A flux gate magnetometer comprising:

an oscillator for generating a signal;

a divider coupled to the oscillator for dividing the frequency of the signal by two;

a sensor coupled to the divider that comprises a drive coil, magnetic core material, a feedback coil, a sense coil, and an analog multiplier having a first input coupled to the sense coil and a second input coupled to the oscillator and an output;

an analog low pass filter coupled to the output of the analog multiplier;

an analog to digital converter coupled to the analog low pass filter;

an adder having one input coupled to an output of the analog to digital converter that provides a feedback output signal; and an accumulator coupled between an output of the adder and a second input of the adder and that provides a digital output signal from the magnetometer; and a digital to analog converter coupled between the digital logic circuit and the feedback coil the sensor for coupling the feedback output signal to the feedback coil of the sensor.

7. The magnetometer of claim 6 wherein the core material is a magnetically saturatable material that is driven into the saturated state twice with every two cycles of the waveform of the output signal from the oscillator.

8. The magnetometer of claim 6 further comprising:

a dither circuit coupled between the adder and an input of the digital to analog converter; and a low pass filter coupled between the digital to analog converter and the sense coil of the sensor.

* * * * *